(12) United States Patent
Koshikawa

(10) Patent No.: US 6,636,448 B2
(45) Date of Patent: Oct. 21, 2003

(54) SEMICONDUCTOR MEMORY DEVICE HAVING FEWER MEMORY CELL PLATES BEING ACTIVATED IN A TEST MODE THAN IN A NORMAL MODE

(75) Inventor: Yasuji Koshikawa, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/867,057

(22) Filed: May 29, 2001

(65) Prior Publication Data
US 2001/0050870 A1 Dec. 13, 2001

(30) Foreign Application Priority Data
May 30, 2000 (JP) ........................ 2000-160788

(51) Int. Cl.$^7$ .............................. G11C 29/00; G11C 7/00
(52) U.S. Cl. ............. 365/201; 365/230.03; 365/230.04; 365/230.06

(58) Field of Search ................................. 365/201, 220, 365/230.03, 230.04, 230.06

(56) References Cited

U.S. PATENT DOCUMENTS 6,469,947 B2 * 10/2002 Park ........................... 365/222
6,502,214 B1 * 12/2002 Pyeon ......................... 714/718

* cited by examiner

Primary Examiner—Van Thu Nguyen
(74) Attorney, Agent, or Firm—Darryl G. Walker; Bradley T. Sako

(57) ABSTRACT

A semiconductor memory device (10) having a normal mode of operation and a test mode of operation is provided. The semiconductor memory device (10) can include a plurality of banks (100A to 100D). A bank (100A) may have a plurality of plates (PLT). In the normal mode of operation a row of plates (11020, 11021, ... 11027) may be activated. In the test mode of operation, half of the row of plates (11020, 11021, ... 11027) may be activated.

20 Claims, 10 Drawing Sheets

SEMICONDUCTOR MEMORY DEVICE HAVING FEWER MEMORY CELL PLATES BEING ACTIVATED IN A TEST MODE THAN IN A NORMAL MODE

TECHNICAL FIELD

The present invention relates generally to semiconductor devices and more particularly to a semiconductor memory device having a parallel test mode in which data can be read out in parallel.

BACKGROUND OF THE INVENTION

A semiconductor memory device, such as a synchronous dynamic random access memory (SDRAM), can be arranged into a plurality of banks. Each bank can operate as an independent memory that can be activated and have data accessed at external data terminals, which may be shared by each bank. For example, an SDRAM may be a X16, in which a 16-bit wide data word may be accessed (read or write) at one time at the external data terminals. Because the 16-bits of data can come from any of the independently operating banks, each bank must be capable of providing 16-bits of data. If the SDRAM has four banks, then internally, there can be at least 64-bits of data being accessed at one time if all the banks are activated, but only 16 of those bits may be accessed externally due to the number of external data terminals (16 in this case).

Thus, if all 64-bits of data are to be read out on the external data terminals, four separate read operations must take place.

Every semiconductor memory device that is produced should be tested to ensure that all addressable bit locations in the memory are functional. Any increase in throughput can reduce the test time, and can decrease the manufacturing costs of the device. In order to decrease test time, a parallel test operation has been developed.

In a parallel test operation, each bank can be simultaneously activated and data can be read out from each bank. Data can be compared on chip and a comparison result can be output on the external data terminals. In this way, 16-bits from each bank and thus 64-bits of data can be tested in a single read operation. This improves the efficiency of the testing of each semiconductor memory device, which can reduce the overall manufacturing cost.

When using the above-mentioned conventional parallel test mode, all the banks are simultaneously activated. This can cause increased current spikes as compared to normal operations, which can cause internal noise on the power bussing, especially during the simultaneous operation of sense amplifiers. These affects can reduce the integrity of the parallel test results.

The above-mentioned affects can be reduced by operating the test under "relaxed" timing conditions, such as increasing the delay time (tRCD) from a row address strobe (RAS) to column address strobe (CAS). This increases the time delay from latching a row address and activating the banks to latching a column address and selecting data to be compared and outputting the result. By doing this, the sense amplifiers can have an increased time to properly sense data. However, by operating under "relaxed" timing conditions, the test time is increased and the test throughput decreases which can increase the overall manufacturing cost.

Parallel test mode of operation can also be used during a burn-in test. In a burn-in test, a large number of devices are tested in parallel and can be under extreme conditions. This can be used to determine the infant mortality. When such a large number of devices are tested in parallel, increased current consumption caused by the conventional parallel test operation can generate an excessive peak current on the power source burn-in test equipment. This can reduce the integrity of the bum-in test data.

In view of the above discussion, it would be desirable to provide a semiconductor device having a reduced peak current consumption and noise generation during sensing. It would also be desirable to decrease the current consumption and noise generation during a parallel test operation.

SUMMARY OF THE INVENTION

According to the present embodiments, a semiconductor device having a normal mode of operation and a test mode of operation is provided. The semiconductor memory may include a memory cell array having a plurality of memory cell plates. In a normal mode of operation a plurality of plates may be activated. In the test mode of operation fewer plates may be activated than in the normal mode of operation.

According to one aspect of the embodiments, the plurality of memory cell plates may be a row of memory cell plates coupled to a main word line disposed in a row direction.

According to another aspect of the embodiments, a sub-word driver may receive a main word line. The sub-word driver may activate a sub-word line in a memory cell plate. In the test mode of operation fewer plates have activated sub-word lines than in the normal mode of operation.

According to another aspect of the embodiments, each memory cell plate may have a first sub-word driver and a second sub-word driver. The second sub-word driver can be on an opposite end of the memory cell plate than the first sub-word driver.

According to another aspect of the embodiments, a decoder circuit can receive a plurality of row address signals and may provide a sub-word line select signal to a sub-word driver. The first sub-word driver of a memory cell plate may be coupled to the same decoder circuit as the second sub-word driver in an adjacent memory cell plate.

According to another aspect of the embodiments, the decoder circuit can be coupled to receive a test mode signal and at least one test control signal. The at least one test control signal can indicate which memory cell plates can be activated in the test mode of operation. The at least one test control signal can have a logic value indicating a logic value of at least one external signal.

According to another aspect of the embodiments, the external signal generating the test control signal may be a data mask signal. The external signal may be sampled at approximately the same time as external row address signals are sampled.

According to another aspect of the embodiments, the memory cell array can include a plurality of rows of memory cell plates.

According to another aspect of the embodiments, the memory cell array may activate at least one of the plurality of rows of memory cell plates in a normal mode. The memory cell array may activate only a portion of at least one of the plurality of rows of memory cell plates in a test mode.

According to another aspect of the embodiments, the row of memory cell plates may be divided into a first group of memory cell plates and a second group of memory cell plates. A group signal may indicate which group of memory cell plates is to be activated in a test mode of operation.

According to another aspect of the embodiments, each memory cell plate in a row of memory cell plates may be coupled to a sense amplifier activation circuit. The sense amplifier activation circuit may be coupled to receive a test mode signal and a test control signal.

According to another aspect of the embodiments, the sense amplifier activation circuit may also be coupled to receiving a row address signal. Sense amplifier activation circuits receive a row address signal may form an exclusive OR/NOR logic function with the test control signal.

According to another aspect of the embodiments, adjacent memory cell plates may be activated in the test mode of operation.

DETAILED DESCRIPTION OF THE EMBODIMENTS

Various embodiments of the present invention will now be described in detail with reference to a number of drawings.

Figure 1:
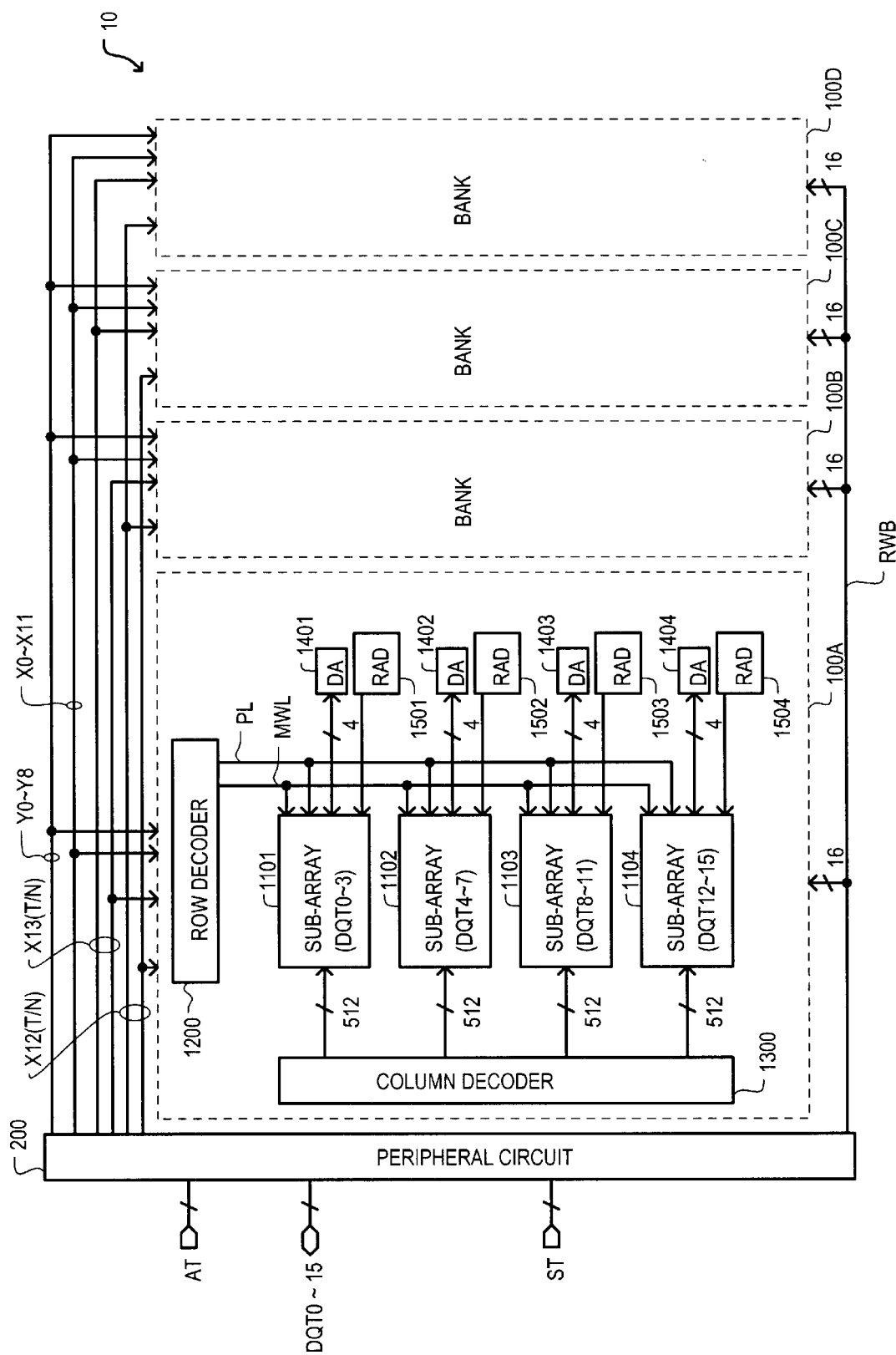
FIG. 1 is a block schematic diagram of a semiconductor memory device according to one embodiment.

Referring now to FIG. 1, a semiconductor memory device according to one embodiment is set forth in a block schematic diagram and given the general reference character 10.

Semiconductor memory device 10 can be a synchronous dynamic random access memory (SDRAM). Semiconductor memory device 10 can include four banks (100A to 100D) and a peripheral circuit 200.

Peripheral circuit 200 can receive external addresses on address bus terminals AT and external control signals on control bus terminals ST. Peripheral circuit 200 can receive or produce external data on data bus terminals (DQT0 to DQT15).

Each bank (100A to 100D) can receive row address signals (X0 to X13) and column address signals (Y0 to Y8) from the peripheral circuit 200. Each bank (100A to 100D) may also be connected to the peripheral circuit by a read/write data bus RWB.

Based on various control signals received on the control bus terminals ST and address signals received on the address bus terminals AT, peripheral circuit 200 may receive data input or generate data output by way of data bus terminals (DQT0 to DQT15). Data may be transmitted back and forth between peripheral circuit 200 and banks (100A to 100D) via read/write data bus RWB. Read/write data bus RWB may have a width of 16-bits.

Each bank (100A to 100D) can include a memory cell array divided into sub-arrays (1101 to 1104). Each bank (100A to 100D) can also include a row decoder 1200, column decoder 1300, data amplifiers (1401 to 1404), and RA drivers (1501 to 1504).

Sub-array 1101 can store data corresponding with data bus terminals (DQT0 to DQT3). Sub-array 1102 can store data corresponding with data bus terminals (DQT4 to DQT7). Sub-array 1103 can store data corresponding with data bus terminals (DQT8 to DQT11). Sub-array 1104 can store data corresponding with data bus terminals (DQT12 to DQT15). Thus, each sub-array (1101 to 1104) can store data corresponding with four bits from the 16 data bus terminals (DQT0 to DQT15).

Row decoder 1200 can receive row address signals (X0 to X13) from peripheral circuit 200 and can select a row of memory cells in the memory cell array having sub-arrays (1101 to 1104). This may be accomplished by activating a main word line and a plate selecting line (to be described later) based on the row address signals (X0 to X13) received by the row decoder 1200.

Column decoder 1300 can receive column address signals (Y0 to Y8) from peripheral circuit 200 and may select columns from the memory cell array having (1101 to 1104).

Data amplifiers (1401 to 1404) may each amplify 4-bits of data to be output from each of the sub-arrays (1101 to 1104) in a read operation.

RA drivers (1501 to 1504) may generate signals for selectively driving a sub-word line in the sub-arrays (1101 to 1104), which will be discussed later.

Figure 2:
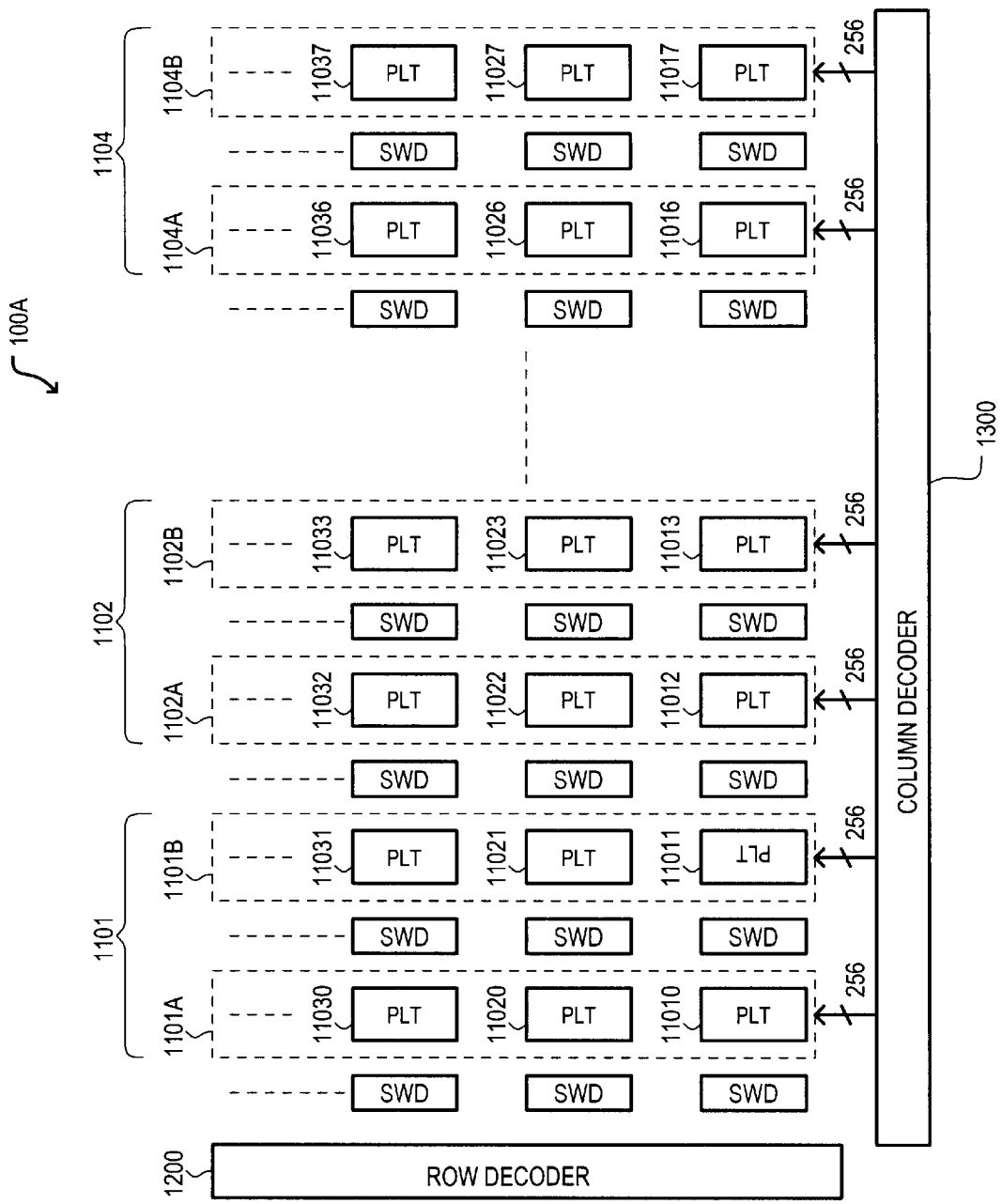
FIG. 2 is a block schematic diagram of a bank according to one embodiment.

Referring now to FIG. 2, a bank according to one embodiment is set forth in a block schematic diagram and given the general reference character 100A. The bank 100A in FIG. 2 can correspond to bank 100A of FIG. 1.

Bank 100A can include sub-arrays (1101 to 1104), a row decoder 1200, and column decoder 1300.

Each sub-array (1101 to 1104) can include plates PLT and sub-word drivers SWD, which can be arranged in eight rows and two columns. Each sub-array (1101 to 1104) can include two areas. As an example, sub-array 1101 can include sub-array areas (1101A and 1101B). In sub-array area 1101A there can be eight plates (11010, 11020, 11030, . . . , 1180).

In each plate PLT, sixty-four main word lines may be disposed in the row direction.

Thus, in each sub-array (1101 to 1104) 512 main word lines may be disposed in the row direction. Row decoder 1200 can select one of the 512 main word lines based on the value of a row address received.

Figure 3:
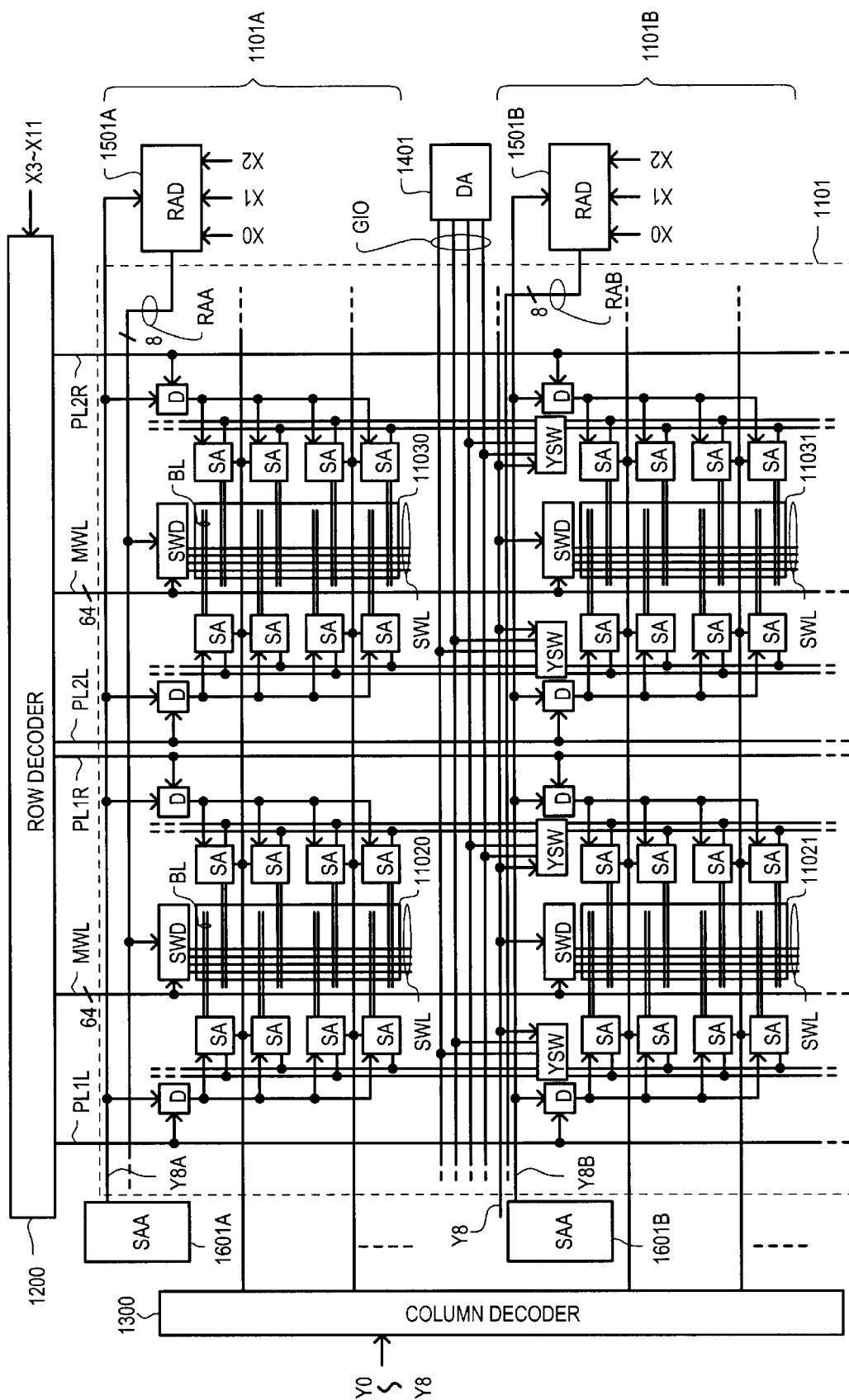
FIG. 3 is a block schematic diagram of portion of sub-array according to one embodiment.

Referring now to FIG. 3, a portion of sub-array 1101 according to one embodiment is set forth in a block schematic diagram.

The portion of sub-array 1101 can include portions of sub-array areas (1101A and 1101B). The portion of sub-array 1101 can include plates (11020, 11021, 11030, and

11031). Main word lines MWL may be disposed in the row direction of sub-array 1101. A sub-word driver SWD may receive a main word line and may select a sub-word line SWL within a plate (11020, 11021, 11030, and 11031). Sub-word line SWL may be selected based on a selected RAA signal from a RA driver (1501A and 1501B). A sub-word driver SWD may be provided on one-side of each plate (11020, 11021, 11030, and 11031).

Each sub-word driver SWD may receive one main word line from row decoder 1200 and may provide eight sub-word lines as outputs. Although only one sub-word driver SWD is shown for each plate in FIG. 3, it is understood that there may be one sub-word driver SWD for each main word line MWL provided for a plate (11020, 11021, 11030, and 11031). Thus, there may be sixty-four sub-word drivers SWD for each plate (11020, 11021, 11030, and 11031). Each sub-word driver SWD may provide eight sub-word lines SWL, thus, there may be 512 sub-word lines SWL in each plate (11020, 11021, 11030, and 11031).

Plate selecting lines (PL1L, PL1R, PL2L, and PL2R) may be provided in a row direction such that a particular row of plates (for example, 11020, 11021, 11022, . . . 11027 of FIG. 2) may receive a pair of plate selecting lines (for example, PL1L and PL1R). Plate selecting lines (for example, PL1L and PL1R) may be used to activate sense amplifiers SA in a row of selected plates (for example, 11020, 11021, 11022, . . . 11027 of FIG. 2). This can be illustrated in FIG. 3; plate selecting lines (PL1L and PL1R) may be generated by row decoder 1200 and may be coupled through sense amplifier driver D to activate sense amplifiers SA in a row of selected plates (11020, 11021, . . . ).

Each sub-array area (1101A and 1101B) can include a sense amplifier activating control unit SAA and RA driver (RAD). Sense amplifier activating control unit SAA may provide a control signal (Y8A or Y8B) to sense amplifier driver D. Sense amplifier activating control unit SAA may also provide control signal (Y8A or Y8B) to the RA driver (RAD). In this way, sense amplifier activating control unit SAA may enable a column of plates PLT. Because this same general structure may be repeated throughout the bank, sense amplifier activating control unit SAA may enable all even columns or all odd columns of plates with control signals (Y8A and Y8B).

As seen in FIG. 3, RA driver 1501A may provide an 8-bit sub-word line selection signals RAA to a column of sub-word drivers SWD in a column of plates in which plates 11020 and 11030 belong. RA driver 1501B may provide an 8-bit sub-word line selection signals RAA to a column of sub-word drivers SWD in a column of plates in which plates 11021 and 11031 belong.

Figure 4:
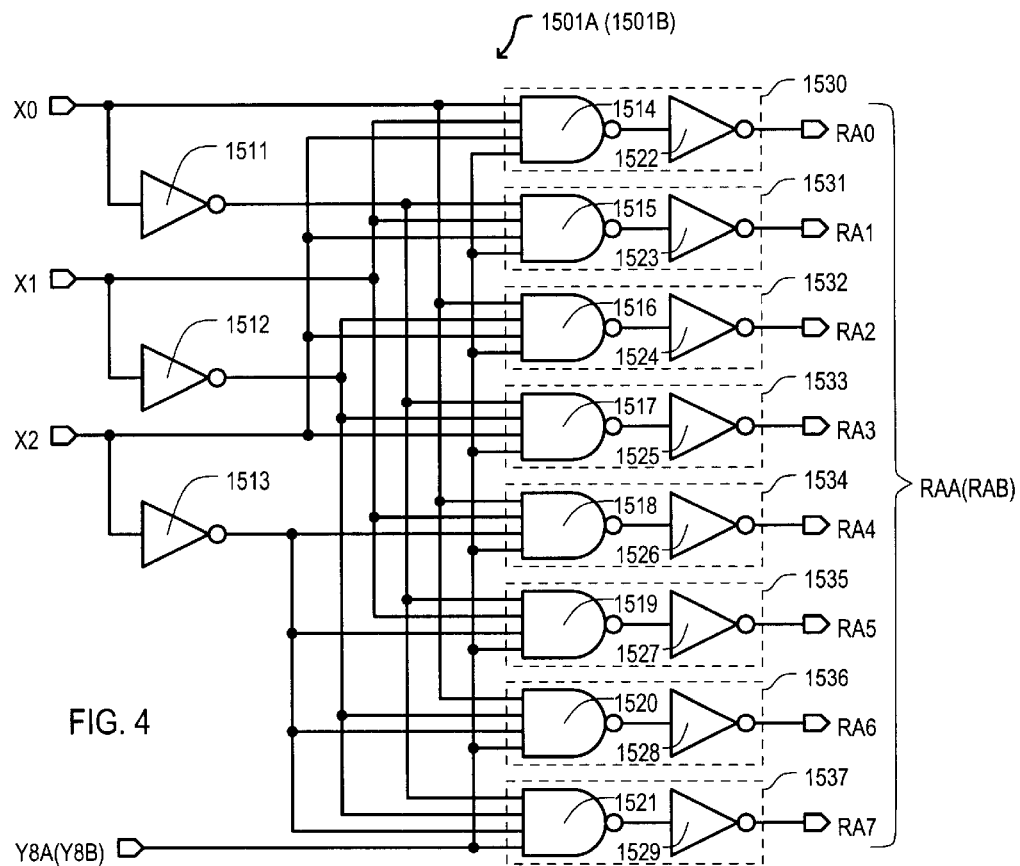
FIG. 4 is a circuit schematic diagram of a RA driver according to one embodiment.

Referring now to FIG. 4, RA driver 1501A(B) according to one embodiment is set forth in a circuit schematic diagram. RA driver 1501A(B) may correspond to RA driver 1501A and 1501B in FIG. 3.

RA driver 1501A(B) can receive address signals (X0 to X2) and may produce RA signals (RA0 to RA7). RA driver 1501A(B) can include decode circuits (1530 to 1537) and inverters (1511 to 1513). Each decode circuit can include a NAND gate and an inverter. For example, decode circuit 1530 can include NAND gate 1514 and inverter 1522. Each decode circuit (1530 to 1537) can produce a respective RA signal (RA0 to RA7). Inverters (1511 to 1513) can serve to invert address signals (X0 to X2) so that each decode circuit (1530 to 1537) can receive a unique combination of address signals (X0 to X2). Each decode circuit (1530 to 1537) may receive a unique combination of address signals (X0 to X2) or inverted address signals at a respective NAND gate (1514 to 1521). An inverter (1522 to 1529) may be connected to receive an output from a respective NAND gate (1514 to 1521) and may provide an RA signal (RA0 to RA7) as an output.

RA driver 1501A(B) may also receive a control signal Y8A(Y8B). For example, RA driver 1501A of FIG. 3 may receive control signal Y8A. RA driver 1501B of FIG. 3 may receive control signal Y8B. When logic high, control signal Y8A(Y8B) may enable RA driver 1501A(B). When enabled, RA driver 1501A(B) can activate one RA signal (RA0 to RA7) for each value of address signals (X0 to X2). When logic low, control signal Y8A(Y8B) may force all RA signals (RA0 to RA7) to be deactivated or logic low. This may prevent a sub-word line SWD (FIG. 3) from being activated in a respective column of plates PLT.

Figures 5A, 5B:
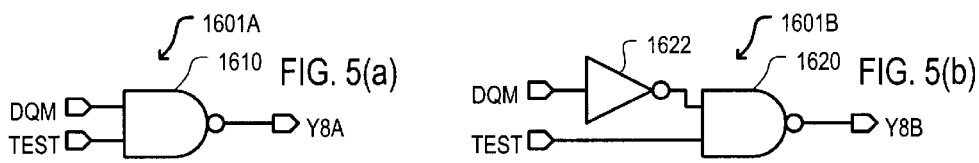
FIGS. 5(a) and (b) are circuit schematic diagrams of sense amplifier activating circuits according to one embodiment.

Referring now to FIGS. 5(*a*) and 5(*b*), sense amplifier activating circuits (1601A and 1601B) are set forth in a circuit schematic diagram.

FIG. 5(*a*) sets forth sense amplifier activating circuit 1601A and FIG. 5(*b*) sets forth sense amplifier activating circuit 1601B. Sense amplifier activating circuits (1601A and 1601B) may correspond to sense amplifier activating circuits (1601A and 1601B) of FIG. 3.

Sense amplifier activating circuit 1601A may receive a test mode signal TEST and an external signal DQM and may generate control signal Y8A. Sense amplifier activating circuit 1601A can include a NAND gate 1610. NAND gate 1610 may receive test mode signal TEST and external signal DQM at inputs and may produce control signal Y8A at an output.

Sense amplifier activating circuit 1601B may receive a test mode signal TEST and external signal DQM and may generate control signal Y8B. Sense amplifier activating circuit 1601B can include a NAND gate 1620 and an inverter 1622. Inverter 1622 may receive external signal DQM and may provide an output to an input of NAND gate 1620. NAND gate 1620 may receive test mode signal TEST at an input and may produce control signal Y8B at an output.

The operation of the semiconductor memory device 10 will now be discussed with reference to FIGS. 1 to 5.

Referring now to FIG. 1, in a normal read operation, an activation command along with a row and bank address may be input at control bus ST and address bus AT. This can cause a bank, for example bank 100A to become active.

Referring now to FIG. 3, based on the received row address (X3~X11) row decoder 1200 may activate a main word line MWL according to the row address value received. As an example, it is assumed the row address value (X3~X11) corresponds to a main word line MWL connected to the row of plates (11020, 11021, . . . , 11027).

Referring now to FIG. 5, during a normal mode of operation, test signal TEST may be logic low. Sense amplifier activating circuits (1601A and 1601B) may each produce a logic high control signal (Y8A and Y8B).

Referring now to FIG. 4, with both control signals (Y8A and Y8B) logic high, RA drivers (1501A and 1501B) may each activate a RA signal (RA0 to RA7) based on value of addresses (X0 to X2). Addresses (X0 to X2) may be row addresses.

Referring once again to FIG. 3, because both control signals (Y8A and Y8B) are logic high, RA drivers 1501A and 1501B activate a RA signal (RA0 to RA7). The sub-word decoder SWD (out of the 64 sub-word decoders in each selected plate (11020, 11021, . . . , 11027)) may receive the activated main word line MWL and may select one of the eight sub-word lines SWL based on the activated RA signal (RA0 to RA7).

After a sufficient differential potential has developed on bit lines BL, sense amplifier drivers D may be activated by plate selecting lines (PL1L and PL2R). Because both control signals (Y8A and Y8B) are logic high, the sense amplifiers connected to the row of selected plates (11020, 11021, ... , 11027) may be activated and can sense data from the memory cells connected to the selected sub-word lines.

Then, based upon a read command along with a column address input at control bus ST and address bus AT. Column decoder 1300 may activate a column selection signal for every other selected plate (11020, 11021, ... , 11027). The column selection signal may allow four sense amplifiers SA from each selected plate (11020, 11021, ... , 11027) to pass data onto local I/O lines within each plate (11020, 11021, ... , 11027).

Also, column address Y8 may be connected to a Y-switch circuit for selecting either the even plates (11020, 11022, ... 11026) or the odd plates (11021, 11023, ... , 11027) to pass data from the local I/O lines onto global I/O lines GIO. Global I/O lines may be shared among two adjacent columns of plates PLT. Thus, four bits of data can be output from sub-array 1101 to data amplifier 1401.

Referring now to FIG. 1, in this manner, each sub-array (1101 to 1104) can produce four bits of data to a data amplifier (1401 to 1404). This can allow sixteen bits of data to be read out onto external data bus DQT0 to DQT15.

It is noted that in the normal read operation, a row of plates (11020, 11021, ... , 11027) can be activated.

Now a parallel test mode of operation will be discussed with reference to FIG. 1 to 5. The parallel test mode is presumed to have a row address that is identical to the normal read mode discussed above.

First, a test command may be executed. The test command may cause test signal TEST to become logic high.

Then an activate command may be entered as before. However, in the test case all the banks (100A to 100D) may become activated. Also, during the activate command an external signal DQM may be provided.

A row decoder 1200 in each bank (100A to 100D) may activate a main word line MWL.

Referring now to FIG. 5, when test signal TEST is high, sense amplifier activating circuits (1601A and 1601B) may activate a control signal (Y8A or Y8B) based on the value of external signal DQM, which may have been latched internally during the activate command. If external signal DQM is logic low, control signal Y8B may be activated. If external signal DQM is logic high, control signal Y8A may be activated.

Now, referring to FIG. 3, with only one of the control signals (Y8A or Y8B) activated, only every other one of the plates may be activated. For example, when control signal Y8A is activated even plates (11020, 11022, ... , 11026) may be activated. When control signal Y8B is activated odd plates (11021, 11023, ... , 11027) may be activated.

Control signals (Y8A and Y8B) may be provided to respectively control even plate or odd plate sub-word decoders SWD, column switches YSW, and sense amplifier drivers D. Control signals (Y8A and Y8B) may respectively control even or odd plate sub-word decoders SWD by way of RA drivers (1501A and 1501B).

In this example, it is assumed that external signal DQM is logic high. In this case, control signal Y8A would be logic high and control signal Y8B would be logic low.

Based on the received row address (X3~X11) row decoder 1200 may activate a main word line MWL according to the row address value received. As an example, it is assumed the row address value (X3~X11) corresponds to a main word line MWL connected to the row of plates (11020, 11021, ... , 11027).

Referring now to FIG. 4, with control signal Y8A is logic high, RA driver 1501A may activate a RA signal (RA0 to RA7) based on value of addresses (X0 to X2). Addresses (X0 to X2) may be row addresses. With control signal Y8B logic low, RA driver 1501B may not be enabled and its respective RA signals (RA0 to RA7) may remain logic low.

Referring once again to FIG. 3, because only control signal Y8A is logic high, RA driver 1501A activates a RA signal (RA0 to RA7). The sub-word decoder SWD (out of the 64 sub-word decoders in each even plate (11020, 11022, ... , 11026)) may receive the activated main word line MWL and may select one of the eight sub-word lines SWL based on the activated RA signal (RA0 to RA7).

After a sufficient differential potential has developed on bit lines BL, sense amplifier drivers D may be activated by plate selecting lines (PL1L and PL1R). Because only control signal Y8A is logic high, the sense amplifiers connected to the row of even plates (11020, 11022, ... , 11026) may be activated and can sense data from the memory cells connected to the selected sub-word lines.

Then, based upon a read command along with a column address input at control bus ST and address bus AT. Column decoder 1300 may activate a column selection signal for every even plate (11020, 11022, ... , 11026). The column selection signal may allow four sense amplifiers SA from even plates (11020, 11022, ... , 11026) to pass data onto local I/O lines within each plate (11020, 11022, ... , 11026).

Also, column address Y8 may be connected to a Y-switch circuit for selecting either the even plates (11020, 11022, ... 11026) or the odd plates (11021, 11023, ... , 11027) to pass data from the local I/O lines onto global I/O lines GIO. Column address Y8 may carry the same information as the external signal DQM so that the even plates (11020, 11022, ... 11026) may have their data passed to the global VO lines GIO. Global I/O lines may be shared between two adjacent columns of plates PLT. Thus, four bits of data can be output from sub-array 1101 to data amplifier 1401.

Referring now to FIG. 1, in this manner, each sub-array (1101 to 1104) from each bank (100A to 100D) can produce four bits of data to a data amplifier (1401 to 1404). This can allow sixteen bits of data from each bank to be accessed at the data amplifiers (1401 to 1404). A comparator/data compression circuit (not shown) may be used to compare the sixteen bits of data from each bank (100A to 100D) and thus sixty-four bits total. A resultant may be output onto the read/write bus RWB and then to the external data bus (DQT0 to DQT15). In this way, sixty-four bits may be tested in a single read cycle.

In this way, a parallel test mode may include active banks (100A to 100D) with fewer plates PLT activated than in a normal mode. This can reduce power consumption per active bank than in a normal operation. In particular, because only one-half as many sense amplifiers per bank may be activated in the test mode as in a normal mode, current spikes caused by sensing may be reduced. Noise on internal power supply lines may be reduced. If the semiconductor memory device is being tested in a burn-in environment, the power supply of the burn-in machine may have reduced noise.

Figure 6:
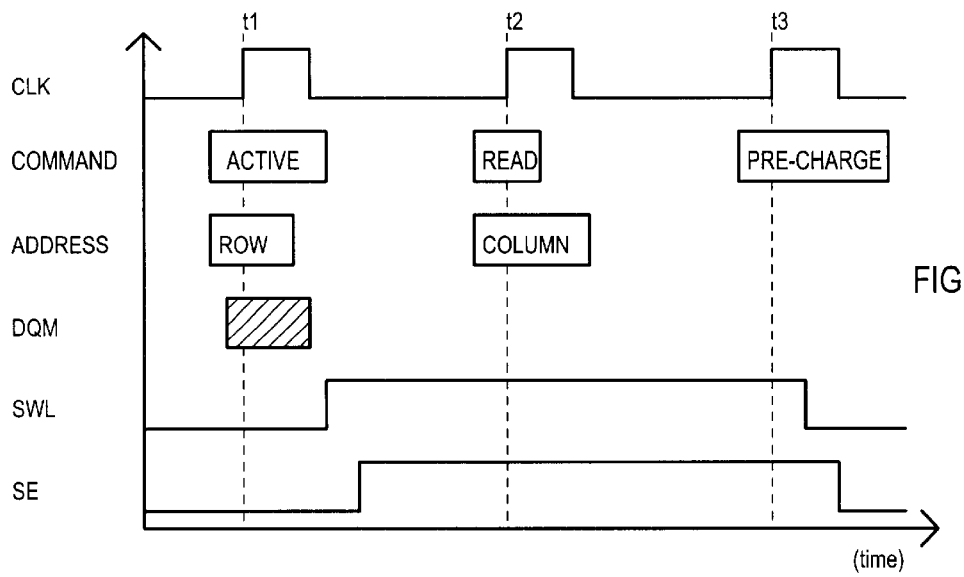
FIG. 6 is a timing diagram illustrating the parallel test operation according to one embodiment.

Referring now to FIG. 6, waveforms illustrating the parallel test operation is set forth in a timing diagram.

The waveforms of FIG. 6 can include, an external clock CLK, a command CMD, external address ADD, external signal DQM, a sub-word line SWL, and a sense amplifier activating signal SE (the output of sense amplifier driver D).

At time t1, the test mode may be entered and an activate command may be received at the rising edge of external clock CLK. At this time, a row address may be applied. The row address may correspond to the row address in which data is to be read and compared. Also, at time t1 external signal DQM may be applied to determine whether even plates PLT or odd plates PLT may be activated. In this case, external signal DQM may have a value of logic low. External signal DQM may be a DQ mask signal, which may be used to mask data bits or bytes in a normal read or write operation, as just one example.

Shortly after t1, a sub-word line in the selected even plates (DQM is low) may go high. When there is sufficient split on the bit lines BL, the sense amplifier activating signal SE for the selected even plates may become active and a row of data may be sensed by the sense amplifiers SA. Control signal Y8A (not shown) may be logic high and may serve to enable the even plates. Control signal Y8B (not shown) may be logic low and may serve to disable the odd plates.

Sense amplifiers SA may serve to latch the data, to be accessed upon a read command. It is noted that four banks may be active at this time in the same way.

At time t2, a read command may be received at the rising edge of external clock CLK. At this time, a column address may be applied. The applied column address can determine which sixteen bits from each bank (100A to 100D) may be accessed for the sixty-four bit parallel test. Control signal Y8A (not shown) may be logic high and may serve to enable the y-switches YSW of even plates. Control signal Y8B (not shown) may be logic low and may serve to disable the y-switches of odd plates.

At time t3, a pre-charge operation may be received at the rising edge of external clock CLK. The pre-charge operation may cause selected sub-word lines SWL to return low and sense amplifier activating signal SE to return low. Pre-charge operation may also equalize bit lines BL in preparation for the next activation command. It should be noted that there may be many read operations similar to the read operation at time t2 between the activate command and pre-charge command. In this way, all the bits connected to the selected sub-word lines SWL may be tested.

It is noted, that external DQM is sampled by the semiconductor memory device at the same time as the row address is input in the test mode. By sampling the external signal DQM at this time, a separate operation may not be needed to select the plates PLT (even/odd) that are to be activated.

External DQM may be sampled at other times. For example, it may be sampled at the last read command (when column address COL is sampled) in the previous activation.

It may also be possible to sample external DQM when executing the read command in the current parallel test operation. In this case, row path activation may be delayed until external DQM has been sampled.

Also, the parallel test mode of operation may have a special test mode entry command in which external DQM may be sampled and latched. A test mode exit command may be needed and another entry command may be executed in order to change the latched value.

Although external DQM has been used to set control signals R8A and R8B, for selecting even or odd plates PLT, it is just exemplary. Other external signals may be used.

A second embodiment will now be described with reference to FIGS. 7–14.

Figure 7:
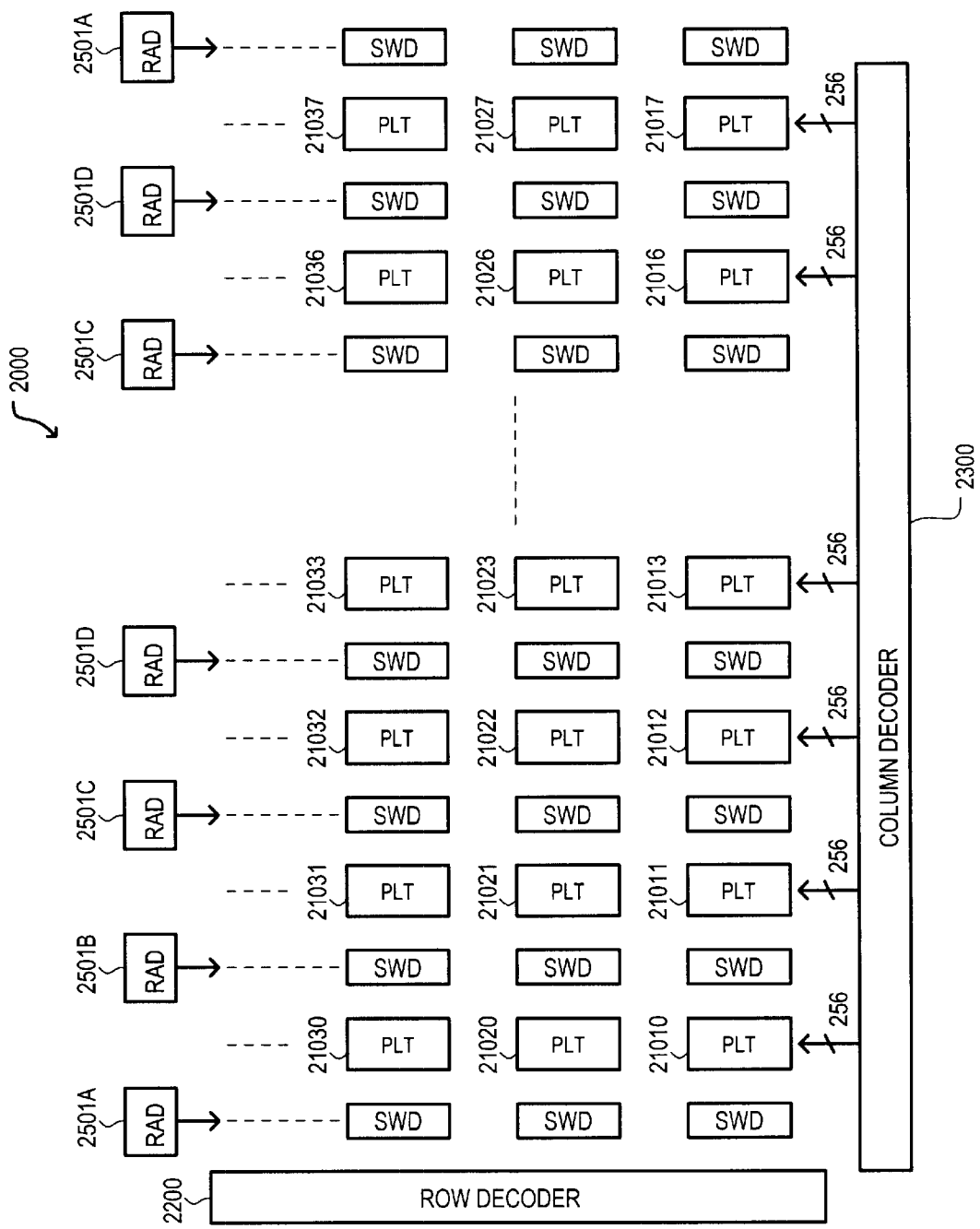
FIG. 7 is a block schematic diagram of a bank according to one embodiment.

Referring now to FIG. 7, a bank according to a second embodiment is set forth in a block schematic diagram and given the general reference character 2000. The bank 2000 in FIG. 7 can correspond to a bank (100A to 100D) of FIG. 1.

Bank 2000 can include a row decoder 2200 and a column decoder 2300. Bank 2000 can also include a plurality of plates PLT arranged in eight rows and eight columns. Plates PLT may have a sub-word driver SWD arranged on each side. A column of sub-word drivers SWD may be connected to receive outputs from a RA driver RAD.

Bank 2000 may differ from bank 100A of FIG. 2, in that each plate PLT may have a sub-word driver SWD on each side. Thus, when a column of sub-word drivers SWD is enabled, a sub-word line may be selectively driven on adjacent plates PLT from the selected column of sub-word drivers.

Figure 8:
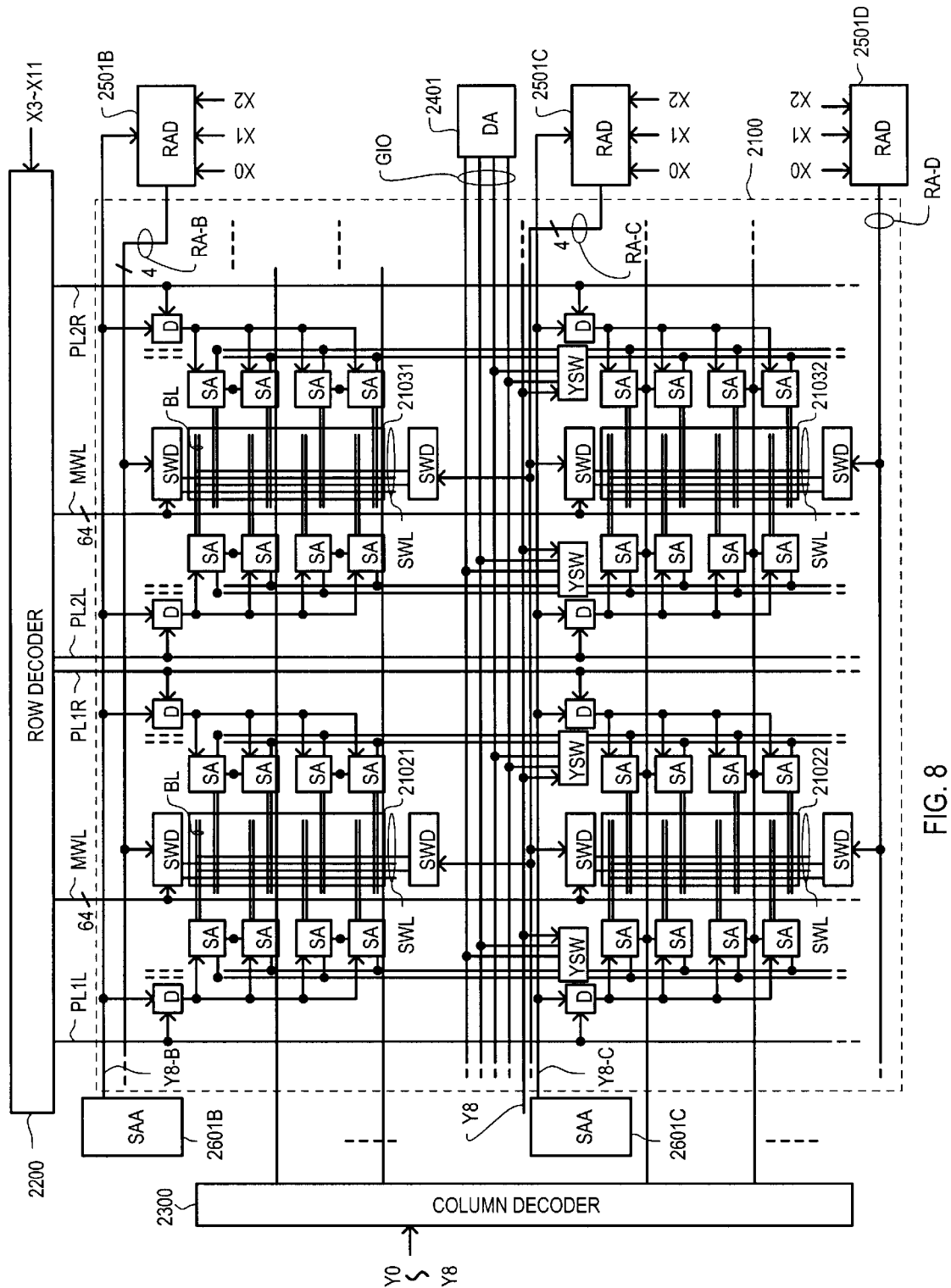
FIG. 8 is a block schematic diagram of portion of a bank according to one embodiment.

Referring now to FIG. 8, a portion of bank 2000 according to the second embodiment is set forth in a block schematic diagram. The portion of bank 2000 can include a group of plates 2100.

The group of plates 2100 can include plates (21021, 21022, 21031, and 21032). Main word lines MWL may be disposed in the row direction of plates 2100. A sub-word driver SWD may receive a main word line and may select a sub-word line SWL within a plate (21021, 21022, 21031, and 21032). Sub-word line SWL may be selected based on a selected RA signal (RA-B, RA-C, or RA-D) from a RA driver (2501B, 2501C, or 2501D). A sub-word driver SWD may be provided on opposing sides of each plate (21021, 21022, 21031, and 21032).

Each sub-word driver SWD may receive one main word line from row decoder 2200 and may provide four sub-word lines as outputs. Although only one sub-word driver SWD is shown on each side for each plate in FIG. 8, it is understood that there may be one sub-word driver SWD on opposite plate sides for each main word line MWL provided for a plate (21021, 21022, 21031, and 21032). Thus, there may be sixty-four sub-word drivers SWD on opposite sides of each plate (21021, 21022, 21031, and 21032). Each sub-word driver SWD may provide four sub-word lines SWL, thus, there may be 512 sub-word lines SWL in each plate (21021, 21022, 21031, and 21032).

Plate selecting lines (PL1L, PL1R, PL2L, and PL2R) may be provided in a row direction such that a particular row of plates (for example, 21020, 21021, 21022, . . . 21027 of FIG. 7) may receive a pair of plate selecting lines (for example, PL1L and PL1R). Plate selecting lines (for example, PL1L and PL1R) may be used to activate sense amplifiers SA in a row of selected plates (for example, 21020, 21021, 21022, . . . 21027 of FIG. 2). This can be illustrated in FIG. 8, plate selecting lines (PL1L and PL1R) may be generated by row decoder 2200 and may be coupled through sense amplifier driver D to activate sense amplifiers SA in a row of selected plates (21020, 21021, 21022, . . . ).

Each column of plates (21011, 21021, 21031, . . . 21071, as an example) can include a sense amplifier activating control unit SAA and RA driver (RAD). Sense amplifier activating control unit SAA may provide a control signal (Y8-A to Y8-D) to sense amplifier driver D. Sense amplifier activating control unit SAA may also provide control signal (Y8-A to Y8-D) to the RA driver (RAD). In this way, sense amplifier activating control unit SAA may enable a column of adjacent plates PLT. Because this same general structure may be repeated throughout the bank, sense amplifier activating control unit SAA may enable columns of adjacent plates with control signals (Y8-A to Y8-D). End plates (for example 21010, 21020, . . . 21070) may be enabled without an adjacent plate enabled, as will be described later.

As seen in FIG. 8, RA driver 2501B may provide a 4-bit sub-word line selection signals RA-B to a column of sub-word drivers SWD in a column of plates in which plates 21021 and 21031 belong. RA driver 2501B may also provide a 4-bit sub-word line selection signals RA-B to a column of sub-word drivers SWD in a column of plates in which plates 21020 and 21030 (not illustrated in FIG. 8) belong.

RA driver 2501C may provide a 4-bit sub-word line selection signals RA-C to a column of sub-word drivers SWD in a column of plates in which plates 21021 and 21031 belong. RA driver 2501C may provide a 4-bit sub-word line selection signals RA-C to a column of sub-word drivers SWD in a column of plates in which plates 21022 and 21032 belong.

In this way, RA drivers (2501A to 2501D) may select sub-word drivers SWD in adjacent plates PLT along the column direction (as illustrated in FIGS. 7 and 8).

It is noted that end plates (for example 21010, 21020, . . . 21070 and 21017, 21027, . . . 21077 illustrated in FIG. 7) may not have an adjacent plate PLT on one side.

Figure 9:
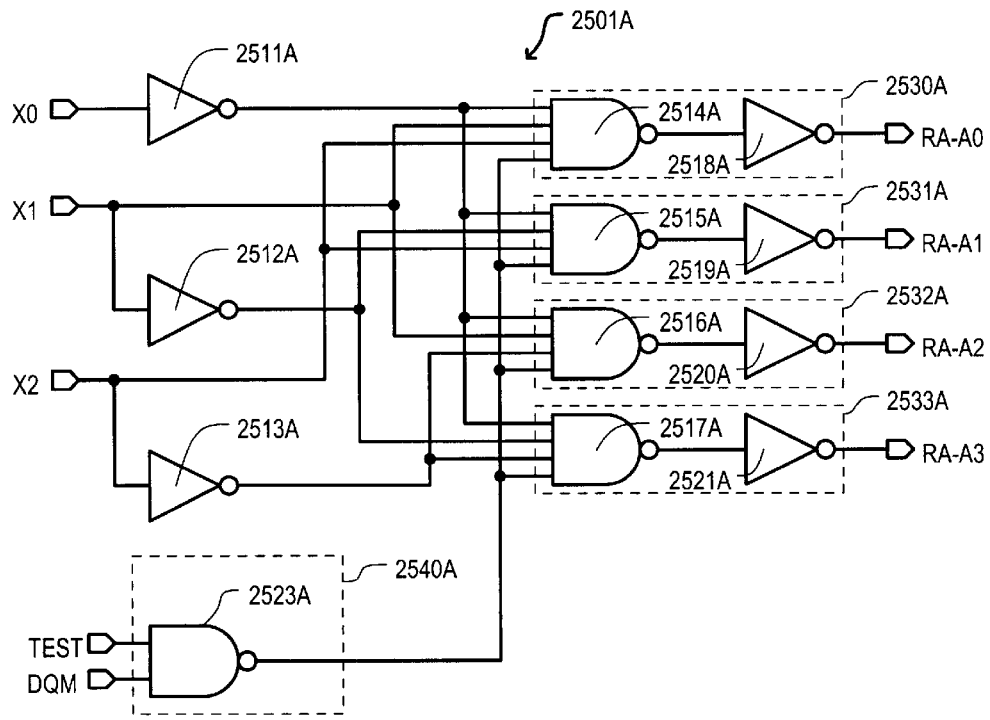
FIG. 9 is a circuit schematic diagram of a RA driver according to one embodiment.

Referring now to FIG. 9, RA driver 2501A according to the second embodiment is set forth in a circuit schematic diagram. RA driver 2501A may correspond to RA driver 2501A of FIG. 7.

RA driver 2501A can receive address signals (X0 to X2) and may produce RA signals (RA-A0 to RA-A3). RA driver 2501A can include decode circuits (2530A to 2533A) and inverters (2511A to 2513A). Each decode circuit can include a NAND gate and an inverter. For example, decode circuit 2531A can include NAND gate 2515A and inverter 2519A. Each decode circuit (2530A to 2533A) can produce a respective RA signal (RA-A0 to RA-A3). Inverters (2511A to 2513A) can serve to invert address signals (X0 to X2). Each decode circuit (2530A to 2533A) may receive a different combination of address signals (X0 to X2) or inverted address signals at a respective NAND gate (2514A to 2521A). An inverter (2518A to 2521A) may be connected to receive an output from a respective NAND gate (2514A to 2517A) and may provide an RA signal (RA-A0 to RA-A3) as an output.

RA driver 2501A may also include a control circuit 2540A. Control circuit 2540A may receive a test signal TEST and an external signal DQM. Control circuit may enable decode circuits (2530A to 2533A) or disable decode circuits (2530A to 2533A) according to the value of test signal TEST and an external signal DQM. Control circuit 2540A may include a 2-input NAND gate 2523A. NAND gate 2523A may receive test signal TEST and an external signal DQM as inputs and may provide a control signal as an output to enable or disable decode circuits (2530A to 2533A) accordingly.

When test signal TEST is logic low, the output of control circuit 2540A can be high and decode circuits (2530A to 2533A) may be enabled. When test signal TEST is logic high, decode circuits (2530A to 2533A) may be enabled if external signal DQM is logic low and disabled if external signal DQM is logic high. When decode circuit 2530A to 2533A is disabled, RA signals (RA-A0 to RA-A3) may all be logic low.

Figure 10:
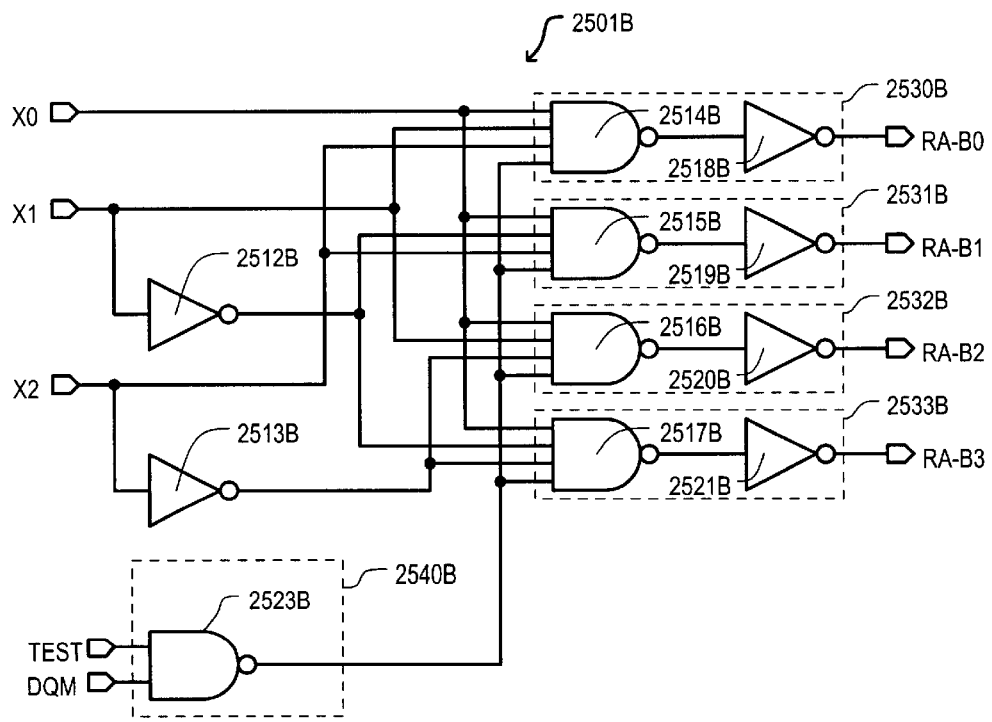
FIG. 10 is a circuit schematic diagram of a RA driver according to one embodiment.
Figure 11:
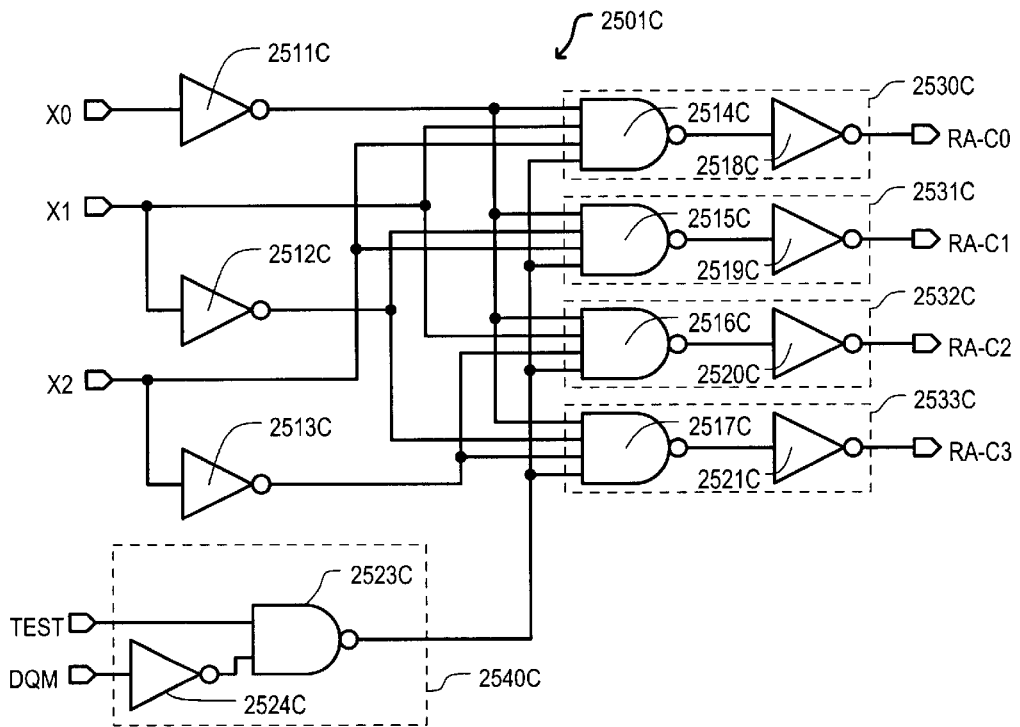
FIG. 11 is a circuit schematic diagram of a RA driver according to one embodiment.

Referring now to FIG. 10, RA driver 2501B according to the second embodiment is set forth in a circuit schematic diagram. RA driver 2501B may correspond to RA driver 2501B of FIGS. 7 and 8.

RA driver 2501B can receive address signals (X0 to X2) and may produce RA signals (RA-B0 to RA-B3). RA driver 2501B can include decode circuits (2530B to 2533B) and inverters (2512B to 2513B). Each decode circuit can include a NAND gate and an inverter. For example, decode circuit 2531B can include NAND gate 2515B and inverter 2519B. Each decode circuit (2530B to 2533B) can produce a respective RA signal (RA-B0 to RAB3). Inverters (2512B to 2513B) can serve to invert address signals (X0 to X2). Each decode circuit (2530A to 2533A) may receive a different combination of address signals (X0 to X2) or inverted address signals at a respective NAND gate (2514B to 2521B). An inverter (2518B to 2521B) may be connected to receive an output from a respective NAND gate (2514B to 2517B) and may provide an RA signal (RA-B0 to RA-B3) as an output.

RA driver 2501B may also include a control circuit 2540B. Control circuit 2540B may receive a test signal TEST and an external signal DQM. Control circuit may enable decode circuits (2530B to 2533B) or disable decode circuits (2530B to 2533B) according to the value of test signal TEST and an external signal DQM. Control circuit 2540B may include a 2-input NAND gate 2523B. NAND gate 2523B may receive test signal TEST and an external signal DQM as inputs and may provide a control signal as an output to enable or disable decode circuits (2530B to 2533B) accordingly.

When test signal TEST is logic low, the output of control circuit 2540B can be high and decode circuits (2530B to 2533B) may be enabled. When test signal TEST is logic high, decode circuits (2530B to 2533B) may be enabled if external signal DQM is logic low and disabled if external signal DQM is logic high. When decode circuit 2530B to 2533B is disabled, RA signals (RA-B0 to RA-B3) may all be logic low.

RA drivers (2501A and 2501B) may together form a decoder for decoding three address bits (X0 to X2) and enabling one of eight RA signals (RA-A0 to RA-A3 and RA-B0 to RA-B3.

Referring now to FIG. 1, RA driver 2501C according to the second embodiment is set forth in a circuit schematic diagram. RA driver 2501C may correspond to RA driver 2501C of FIG. 7 or 8.

RA driver 2501C can receive address signals (X0 to X2) and may produce RA signals (RA-C0 to RA-C3). RA driver 2501C can include decode circuits (2530C to 2533C) and inverters (2511C to 2513C). Each decode circuit can include a NAND gate and an inverter. For example, decode circuit 2531C can include NAND gate 2515C and inverter 2519C. Each decode circuit (2530C to 2533C) can produce a respective RA signal (RA-C0 to RA-C3). Inverters (2511C to 2513C) can serve to invert address signals (X0 to X2). Each decode circuit (2530C to 2533C) may receive a different combination of address signals (X0 to X2) or inverted address signals at a respective NAND gate (2514C to 2517C). An inverter (2518C to 2521C) may be connected to receive an output from a respective NAND gate (2514C to 2517C) and may provide an RA signal (RA-C0 to RA-C3) as an output.

RA driver 2501C may also include a control circuit 2540C. Control circuit 2540C may receive a test signal TEST and an external signal DQM. Control circuit may enable decode circuits (2530C to 2533C) or disable decode circuits (2530C to 2533C) according to the value of test signal TEST and an external signal DQM. Control circuit 2540C may include a 2-input NAND gate 2523C and an inverter 2524C. NAND gate 2523C may receive test signal TEST and an external signal DQM through inverter 2524C as inputs and may provide a control signal as an output to enable or disable decode circuits (2530C to 2533C) accordingly.

When test signal TEST is logic low, the output of control circuit 2540C can be high and decode circuits (2530C to 2533C) may be enabled. When test signal TEST is logic high, decode circuits (2530C to 2533C) may be enabled if external signal DQM is logic low and disabled if external signal DQM is logic high. When decode circuit 2530C to 2533C is disabled, RA signals (RA-C0 to RA-C3) may all be logic low.

Figure 12:
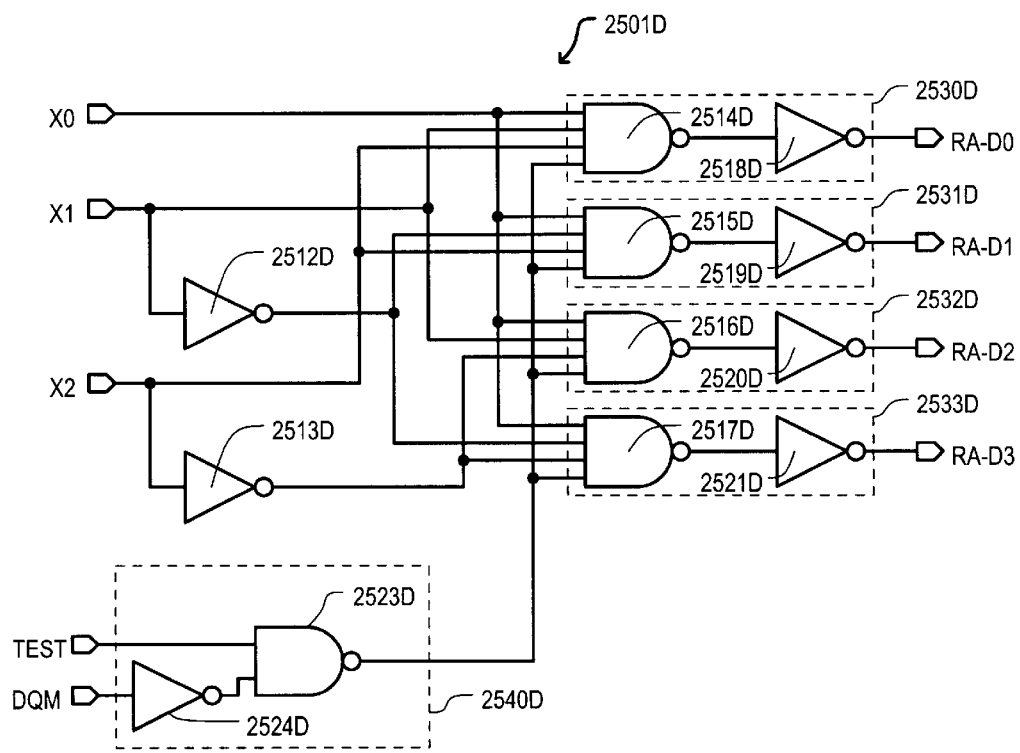
FIG. 12 is a circuit schematic diagram of a RA driver according to one embodiment.

Referring now to FIG. 12, RA driver 2501D according to the second embodiment is set forth in a circuit schematic diagram. RA driver 2501D may correspond to RA driver 2501D of FIG. 7 or 8.

RA driver 2501D can receive address signals (X0 to X2) and may produce RA signals (RA-DO to RA-D3). RA driver 2501D can include decode circuits (2530D to 2533D) and inverters (2512D to 2513D). Each decode circuit can include a NAND gate and an inverter. For example, decode circuit 2531D can include NAND gate 2515D and inverter 2519D. Each decode circuit (2530D to 2533D) can produce a respective RA signal (RA-DO to RA-D3). Inverters (2512D to 2513D) can serve to invert address signals (X1 to X2). Each decode circuit (2530D to 2533D) may receive a different combination of address signals (X0 to X2) or inverted address signals at a respective NAND gate (2514D to 2521D). An inverter (2518D to 2521D) may be connected to receive an output from a respective NAND gate (2514D to 2517D) and may provide an RA signal (RA-D0 to RA-D3) as an output.

RA driver 2501D may also include a control circuit 2540D. Control circuit 2540D may receive a test signal TEST and an external signal DQM. Control circuit may enable decode circuits (2530D to 2533D) or disable decode circuits (2530D to 2533D) according to the value of test signal TEST and an external signal DQM. Control circuit 2540D may include a 2-input NAND gate 2523D and an inverter 2524D. NAND gate 2523D may receive test signal TEST and an external signal DQM through inverter 2524D as inputs and may provide a control signal as an output to enable or disable decode circuits (2530D to 2533D) accordingly.

When test signal TEST is logic low, the output of control circuit 2540D can be high and decode circuits (2530D to 2533D) may be enabled. When test signal TEST is logic high, decode circuits (2530D to 2533D) may be enabled if external signal DQM is logic low and disabled if external signal DQM is logic high. When decode circuit 2530D to 2533D is disabled, RA signals (RA-D0 to RA-D3) may all be logic low.

RA drivers (2501C and 2501D) may together form a decoder for decoding three address bits (X0 to X2) and enabling one of eight RA signals (RA-C0 to RA-C3 and RA-D0 to RA-D3).

Referring now to FIGS. 13(a) to 13(d), sense amplifier activating circuits (2601A to 2601D) are set forth in a circuit schematic diagram.

Figure 13A:
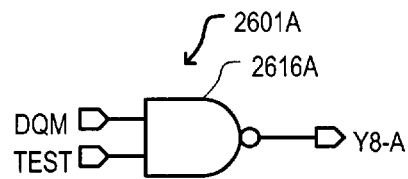
FIG. 13(a)–(d) are circuit schematic diagrams of sense amplifier activating circuits according to one embodiment.
Figure 13B:
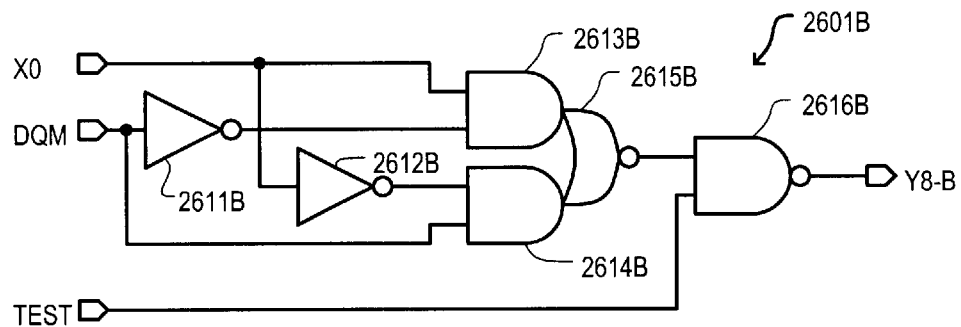
Figure 13C:
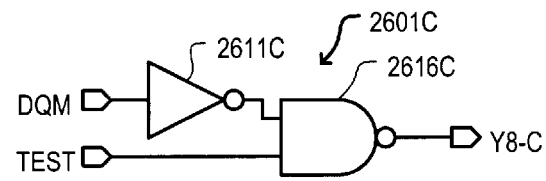
Figure 13D:
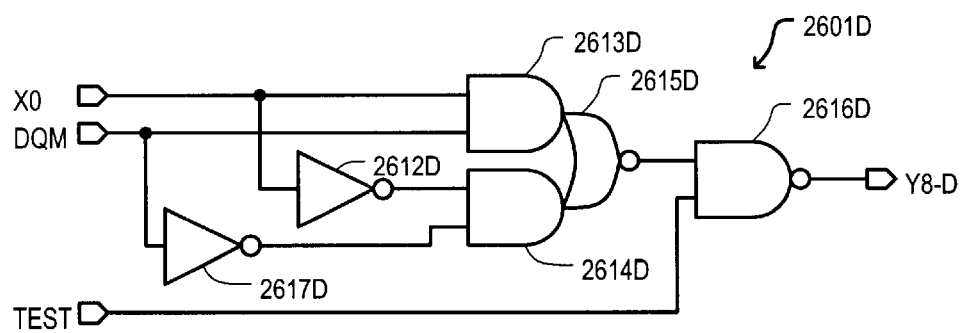

FIG. 13(a) sets forth sense amplifier activating circuit 2601A. FIG. 13(b) sets forth sense amplifier activating circuit 2601B. FIG. 13(c) sets forth sense amplifier activating circuit 2601C. FIG. 13(d) sets forth sense amplifier activating circuit 2601D. Sense amplifier activating circuits (2601B and 2601C) may correspond to sense amplifier activating circuits (2601B and 2601C) of FIG. 8.

Sense amplifier activating circuit 2601A may receive a test mode signal TEST and an external signal DQM and may generate control signal Y8-A. Sense amplifier activating circuit 2601A can include a NAND gate 2616A. NAND gate 2616 may receive test mode signal TEST and external signal DQM at inputs and may produce control signal Y8-A at an output.

Logically, sense amplifier activating circuit 2601A may provide a logic high control signal Y8-A when test mode signal TEST is logic low. When test mode signal TEST is logic low, sense amplifier activating circuit 2601A may provide a control signal Y8-A having the logic inverse of external signal DQM.

Sense amplifier activating circuit 2601B may receive a row address X0, a test mode signal TEST, and external signal DQM and may generate control signal Y8-B. Sense amplifier activating circuit 2601B may include a NAND gate 2616B, NOR gate 2615B, AND gates (2613B and 2614B), and inverters (2611B and 2612B). Inverter 2611B may receive external signal DQM at an input and may provide an output to an input of AND gate 2613B. Inverter 2612B may receive row address X0 at an input and may provide an output to an input of AND gate 2614B. AND gate 2613B may receive row address X0 at an input and may provide an output to an input of NOR gate 2615B. AND gate 2614B may receive external signal DQM at an input and may provide an output to an input of NOR gate 2615B. NOR gate 2615B may provide an output to NAND gate 2616B. NAND gate 2616B may receive test mode signal TEST at an input and may provide control signal Y8-B as an output.

Logically, sense amplifier activating circuit 2601B may provide a logic high control signal Y8-B when test mode signal TEST is logic low.

If test mode signal TEST is logic high (test mode is enabled), control signal Y8-B can depend on the logic values of row address X0 and external signal DQM. When X0 is logic low, control signal Y8-B can have the same logic value as external signal DQM. When X0 is logic high, control signal Y8-B can have the logic inverse value of external signal DQM. When test mode signal TEST is logic high, sense amplifier activating circuit 2601B may form an exclusive-OR logic function of row address X0 and external signal DQM.

Sense amplifier activating circuit 2601C may receive a test mode signal TEST and an external signal DQM and may generate control signal Y8-C. Sense amplifier activating circuit 2601C can include a NAND gate 2616C and an inverter 2611C. Inverter 2611C may receive external signal DQM and may provide an output to an input of NAND gate 2616C. NAND gate 2616C may receive test mode signal TEST at an input and may produce control signal Y8-C at an output.

Logically, sense amplifier activating circuit 2601C may provide a logic high control signal Y8-C when test mode signal TEST is logic low. When test mode signal TEST is logic low, sense amplifier activating circuit 2601C may provide a control signal Y8-C having the logic inverse of external signal DQM.

Sense amplifier activating circuit 2601D may receive a row address X0, a test mode signal TEST, and external signal DQM and may generate control signal Y8-D. Sense amplifier activating circuit 2601D may include a NAND gate 2616D, NOR gate 2615D, AND gates (2613D and 2614D), and inverters (2612D and 2617D). Inverter 2612D may receive row address X0 at an input and may provide an output to an input of AND gate 2614D. Inverter 2617D may receive external signal DQM at an input and may provide an output to an input of AND gate 2614D. AND gate 2613D may receive row address X0 and external signal DQM at an inputs and may provide an output to an input of NOR 2615D. AND gate 2614D may provide an output to an input of NOR 2615D. NOR gate 2615D may provide an output to NAND gate 2616D. NAND gate 2616D may receive test mode signal TEST at an input and may provide control signal Y8-D as an output.

Logically, sense amplifier activating circuit 2601D may provide a logic high control signal Y8-D when test mode signal TEST is logic low.

If test mode signal TEST is logic high (test mode is enabled), control signal Y8-D can depend on the logic values of row address X0 and external signal DQM. When X0 is logic high, control signal Y8-B can have the same logic value as external signal DQM. When X0 is logic low, control signal Y8-B can have the logic inverse value of external signal DQM. When test mode signal TEST is logic high, sense amplifier activating circuit 2601B may form an exclusive-NOR logic function of row address X0 and external signal DQM.

The operation of the semiconductor memory device according to the second embodiment will now be discussed with reference to FIGS. 1 and 7 to 13.

Referring now to FIG. 1, in a normal read operation, an activation command along with a row and bank address may be input at control bus ST and address bus AT. This can cause a bank, for example bank 100A to become active.

Referring now to FIG. 8, based on the received row address (X3~X11) row decoder 2200 may activate a main word line MWL according to the row address value received. As an example, it is assumed the row address value (X3~X11) corresponds to a main word line MWL connected to the row of plates (21020, 21021, . . . , 21027) as shown in FIG. 7.

Referring now to FIGS. 13(a)–(d), during a normal mode of operation, test signal TEST may be logic low. Sense amplifier activating circuits (2601A to 2601D) may each produce a logic high control signal (Y8-A to Y8-D).

Referring now to FIG. 9 to 12, with test signal TEST logic low, RA drivers (2501A and 2501B) may activate one of a RA signal (RA-A0 to RA-A3 and RA-B0 to RA-B3) based on value of addresses (X0 to X2). Addresses (X0 to X2) may be row addresses. Also, RA drivers (2501C and 2501D) may activate one of a RA signal (RA-C0 to RA-C3 and RA-D0 to RA-D3) based on value of addresses (X0 to X2). Thus, in the normal mode of operation, either RA driver 2501A and RA driver 2501C may each activate an RA signal (RA-A0 to RA-A3 and RA-C0 to RA-C3) or RA driver 2501B and RA driver 2501D may each activate an RA signal (RA-B0 to RA-B3 and RA-D0 to RA-D3).

Referring once again to FIG. 8, an RA driver (for example RA driver 2501C) may provide RA signals (RA-C0 to RA-C3) to sub-word decoders SWD in adjacent plates (21021–20122 and 21031–21032). Either, both RA driver 2501A and 2501C may activate an RA signal or both RA driver 2501B and 2501D may activate an RA signal. Thus, every plate may have sub-word decoders SWD on one side that may receive an active RA signal. The other side of every plate PLT may receive only inactive RA signals. For example, referring to FIG. 8, if RA driver 2501C has an active RA signal (RA-C0 to RA-C3), then RA drivers (2501B and 2501D) may have only inactive RA signals (RA-B0 to RA-B3 and RA-D0 to RA-D3). Thus, the sub-word drivers SWD on the bottom of plates (21021 and 21031) and sub-word drivers SWD on the top of plates (21022 and 21032) may be active.

Referring now to FIG. 7, when RA driver 2501C has an active RA signal (RA-C0 to RA-C3), RA driver 2501A may also have an active RA signal (RA-A0 to RA-A3). In this way, sub-word drivers SWD for every plate PLT may receive an active RA signal. Thus a row of plates (for example 21020, 21021, . . . 21027) having an active main word line MWL may each have an active sub-word line SWL.

Referring once again to FIG. 8, after a sufficient differential potential has developed on bit lines BL, sense amplifier drivers D may be activated by plate selecting lines (PL1L and PL1R). Because control signals (Y8-A to Y8-D) are logic high, the sense amplifiers connected to the row of selected plates (21020, 21021, . . . , 21027) may be activated and can sense data from the memory cells connected to the selected sub-word lines.

Then, based upon a read command along with a column address input at control bus ST and address bus AT. Column decoder 2300 may activate a column selection signal for every other selected plate (21020, 21021, . . . , 21027). The column selection signal may allow four sense amplifiers SA from each selected plate (21020, 21021, . . . , 21027) to pass data onto local I/O lines within each plate (21020, 21021, . . . , 21027).

Also, column address Y8 may be connected to a Y-switch circuit for selecting either the even plates (21020, 21022, . . . 21026) or the odd plates (21021, 21023, . . . , 21027) to pass data from the local I/O lines onto global I/O lines GIO. Global I/O lines may be shared among two adjacent columns of plates PLT. Thus, four bits of data can be output from a plate (for example 21021) to data amplifier 2401.

It is noted that in the normal read operation, a row of plates (11020, 11021, . . . , 11027) can be activated.

Now a parallel test mode of operation of the second embodiment will be discussed. The parallel test mode is presumed to have a row address that is identical to the normal read mode discussed above.

First, a test command may be executed. The test command may cause test signal TEST to become logic high.

Then, an activate command may be entered as before. However, in the test case all the banks (100A to 100D, from FIG. 1) may become activated. Also, during the activate command an external signal DQM may be provided.

A row decoder 2200 in may activate a main word line MWL.

Referring now to FIG. 13, when test signal TEST is high, sense amplifier activating circuits (2601A to 2601D) may activate two of control signals (Y8-A to Y8-D) based on the value of external signal DQM and row address X0.

Referring now to FIG. 14(a)–(d), an illustration of plate selection in the test mode is set forth. FIG. 14(a)–(d) can illustrate from which column (in FIG. 7) that a plate may be activated in the test mode.

Referring to FIG. 7, the plates PLT may be divided into two sets of four columns (210x0 to 210x3 and 210x4 to 210x7, where x may be 1 to 7). Each set of four columns may be selected in a similar fashion. Accordingly, FIG. 14 illustrates only one set of four columns of plates.

Figure 14A:
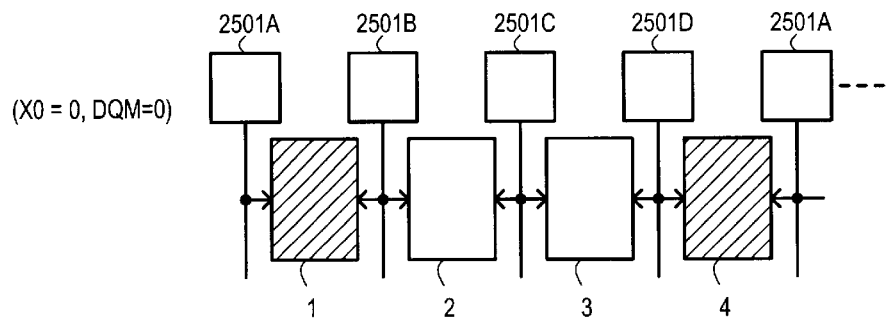
FIG. 14(a)–(d) are block schematic diagrams illustrating plate selection in the test mode according to one embodiment.
Figure 14B:
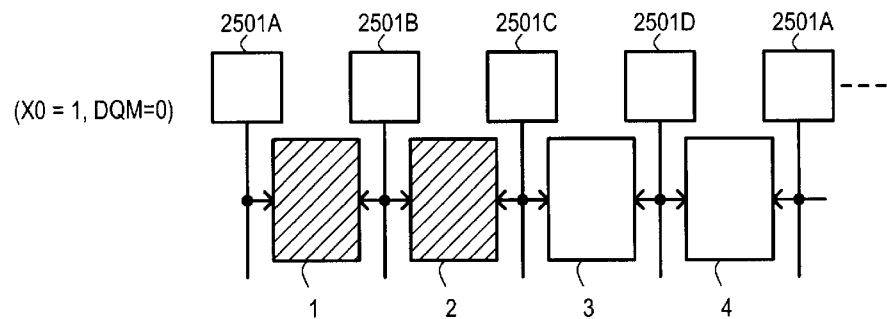
Figure 14C:
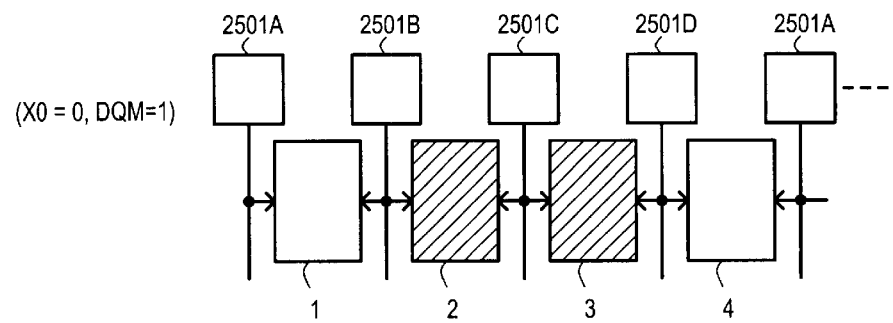
Figure 14D:
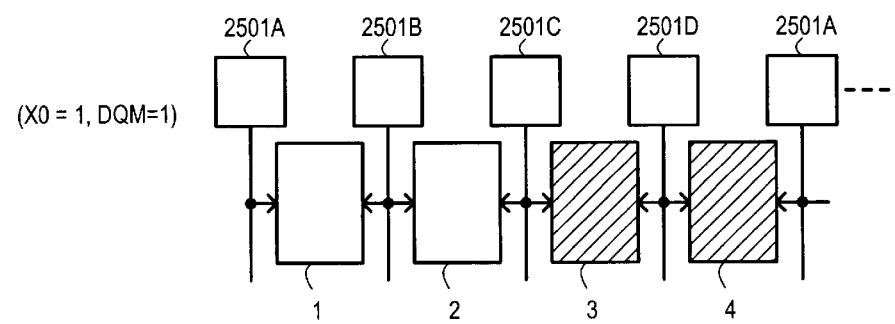

FIG. 14(a) can illustrate the selected column of plates which may be selected during the test mode when row address X0=0 and external signal DQM=0. FIG. 14(b) can illustrate the selected column of plates which may be selected during the test mode when row address X0=1 and external signal DQM=0. FIG. 14(c) can illustrate the selected column of plates which may be selected during the test mode when row address X0=0 and external signal DQM=1. FIG. 14(d) can illustrate the selected column of plates which may be selected during the test mode when row address X0=1 and external signal DQM=1.

For example, in FIG. 14(a), when row address X0=0 and external signal DQM=0, the first and fourth plate (1 and 4) may be selected. Thus, referring once again to FIG. 7 and assuming row decoder 2200 receives a row address activating a main word line connected to the row of plates (21020, 21021, . . . 21027), then plates (21020, 21023, 21024, and 21027) may be activated. In this case, referring to FIG. 13(a)–(d), sense amplifier activation circuits (2601A and 2601D) may activate control signals Y8-A and Y8-D, respectively. Sense amplifier activation circuits (2601B and 2601C) may continue to provide inactive control signals Y8-B and Y8-C, respectively. Referring now to FIG. 8, plate selection signals (PL1L and PL1R) may become active and sense amplifiers SA in plates (21020, 21023, 21024, and 21027) may be activated.

Referring now to FIGS. 9–12, RA driver 2501A may provide an active RA-signal (RA-A0 to RA-A3). RA drivers (2501B to 2501D) may provide inactive RA-signals (RA-B0 to RA-B3 and RA-C0 to RA-C3 and RA-D0 to RA-D3), respectively. RA driver 2501A may provide an active RA-signal to each active plate (21020, 21023, 21024, and 21027). In this way, in conjunction with an activated main word line MWL (FIG. 8), a sub-word line SWL may be selected in each active plate (21020, 21023, 21024, and 21027). It is noted that sub-word lines SWL are selected before sense amplifiers SA may be activated. Row timing circuits (not shown) may provide this function.

In FIG. 14(b), when row address X0=1 and external signal DQM=0, the first and second plates (1 and 2) may be selected. Thus, referring once again to FIG. 7 and assuming row decoder 2200 receives a row address activating a main word line connected to the row of plates (21020, 21021, . . . 21027), then plates (21020, 21021, 21024, and 21025) may be activated. In this case, referring to FIG. 13(a)–(d), sense amplifier activation circuits (2601A and 2601B) may activate control signals Y8-A and Y8-B, respectively. Sense amplifier activation circuits (2601C and 2601D) may continue to provide inactive control signals Y8-C and Y8-D, respectively. Referring now to FIG. 8, plate selection signals (PL1L and PL1R) may become active and sense amplifiers SA in plates (21020, 21021, 21024, and 21025) may be activated.

Referring now to FIGS. 9–12, RA driver 2501B may provide an active RA-signal (RA-B0 to RA-B3). RA drivers (2501A, 2501C, and 2501D) may provide inactive RA-signals (RA-A0 to RA-A3 and RA-C0 to RA-C3 and RA-D0 to RA-D3), respectively. RA driver 2501B may provide an active RA-signal to each active plate (21020, 21021, 21024, and 21025). In this way, in conjunction with an activated main word line MWL (FIG. 8), a sub-word line SWL may be selected in each active plate (21020, 21021, 21024, and 21025). It is noted that sub-word lines SWL are selected before sense amplifiers SA may be activated. Row timing circuits (not shown) may provide this function.

In FIG. 14(c), when row address X0=0 and external signal DQM=1, the second and third plates (2 and 3) may be selected. Thus, referring once again to FIG. 7 and assuming row decoder 2200 receives a row address activating a main word line connected to the row of plates (21020, 21021, . . . 21027), then plates (21021, 21022, 21025, and 21026) may be activated. In this case, referring to FIG. 13(a)–(d), sense amplifier activation circuits (2601B and 2601C) may activate control signals Y8-B and Y8-C, respectively. Sense amplifier activation circuits (2601A and 2601D) may continue to provide inactive control signals Y8-A and Y8-D, respectively. Referring now to FIG. 8, plate selection signals (PL1L and PL1R) may become active and sense amplifiers SA in plates (21021, 21022, 21025, and 21026) may be activated.

Referring now to FIGS. 9–12, RA driver 2501C may provide an active RA-signal (RA-C0 to RA-C3). RA drivers (2501A, 2501B, and 2501D) may provide inactive RA signals (RA-A0 to RA-A3 and RA-B0 to RA-B3 and RA-D0 to RA-D3), respectively. RA driver 2501C may provide an active RA-signal to each active plate (21021, 21022, 21025, and 21026). In this way, in conjunction with an activated main word line MWL (FIG. 8), a sub-word line SWL may be selected in each active plate (21021, 21022, 21025, and 21026). It is noted that sub-word lines SWL are selected before sense amplifiers SA may be activated. Row timing circuits (not shown) may provide this function.

In FIG. 14(d), when row address X0=1 and external signal DQM=1, the third and fourth plates (3 and 4) may be selected. Thus, referring once again to FIG. 7 and assuming row decoder 2200 receives a row address activating a main word line connected to the row of plates (21020, 21021, . . . 21027), then plates (21022, 21023, 21026, and 21027) may be activated. In this case, referring to FIG. 13(a)–(d), sense amplifier activation circuits (2601C and 2601D) may activate control signals Y8-C and Y8-D, respectively. Sense amplifier activation circuits (2601A and 2601B) may continue to provide inactive control signals Y8-A and Y8-B, respectively. Referring now to FIG. 8, plate selection signals (PL1L and PL1R) may become active and sense amplifiers SA in plates (21022, 21023, 21026, and 21027) may be activated.

Referring now to FIGS. 9–12, RA driver 2501D may provide an active RA-signal (RA-D0 to RA-D3). RA drivers (2501A, 2501B, and 2501C) may provide inactive RA signals (RA-A0 to RA-A3 and RA-B0 to RA-B3 and RA-C0 to RA-C3), respectively. RA driver 2501D may provide an active RA-signal to each active plate (21022, 21023, 21026, and 21027). In this way, in conjunction with an activated main word line MWL (FIG. 8), a sub-word line SWL may be selected in each active plate (21022, 21023, 21026, and 21027). It is noted that sub-word lines SWL are selected before sense amplifiers SA may be activated. Row timing circuits (not shown) may provide this function.

In the second embodiment, data from each active plate PLT may be accessed for a parallel test in the test mode, similarly to the first embodiment.

In this way, a parallel test mode may include active banks (100A to 100D) with fewer plates PLT activated than in a normal mode. This can reduce power consumption per active bank than in a normal operation. In particular, because only one-half as many sense amplifiers per bank may be activated in the test mode as in a normal mode, current spikes caused by sensing may be reduced. Noise on internal power supply lines may be reduced. If the semiconductor memory device is being tested in a bum-in environment, the power supply of the bum-in machine may have reduced noise.

By dividing sub-word drivers SWD for a plate PLT into two groups on opposite ends of the plate PLT as illustrated in the second embodiment, a single RA driver RAD may be used to activate a sub-word line SWL in two plates. This may reduce area and may provide a smaller pitch in the layout of sub-word drivers.

It is understood that the embodiments described above are exemplary and the present invention should not be limited to those embodiments. Specific structures should not be limited to the described embodiments.

Although the embodiments were discussed relating to a parallel test mode, it is understood that other test modes of operation may benefit from the invention. Also, the embodiments may be applicable to providing different refresh options on a DRAM, so that power may be distributed with lower current spikes during refreshing, as just one example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
    a memory cell array divided into a plurality of memory cell plates, each memory cell plate having a sub-word driver coupled to a sub-word line disposed in the row direction of the memory cell plate;
    a main word line disposed in the row direction of the memory cell array and coupled to the sub-word driver in a row of said memory cell plates;
    each memory cell plate having a plurality of bit lines, each bit line coupled to a sense amplifier;
    a normal mode of operation in which a sub-word line is selected in each of a plurality of memory cell plates in the row of the memory cell plates and sense amplifiers are activated to receive data provided; and
    a test mode of operation in which fewer memory cell plates in the row of memory cell plates have selected sub-word lines and activated sense amplifiers than in the normal mode of operation.

2. The semiconductor memory device according to claim 1, further including:
    a plurality of sense amplifier activating circuits coupled to receive a test signal and selecting sense amplifiers to be activated.

3. The semiconductor memory device according to claim 2, wherein:
    the plurality of sense amplifier activating circuits are coupled to receive at least one test control signal for selecting which sense amplifiers are activated in the test mode.

4. The semiconductor memory device according to claim 3, wherein:
    the at least one test control signal indicates a logic value of an external signal.

5. The semiconductor memory device according to claim 4, wherein the external signal is a data mask signal.

6. The semiconductor memory device according to claim 2, wherein at least one of the sense amplifier activating circuits is coupled to receive at least one row address signal.

7. The semiconductor memory device according to claim 1, wherein the test mode of operation is a parallel test mode.

8. A semiconductor memory device, comprising:
    a memory cell array including a row of memory cell plates;
    a normal mode of operation in which a plurality of the memory cell plates are activated; and
    a test mode of operation in which fewer of the memory cell plates are activated than in the normal mode.

9. The semiconductor memory device according to claim 8, wherein the memory cell array includes a plurality of rows of memory cell plates.

10. The semiconductor memory device according to claim 9, further including a decoder circuit for providing a selection signal for selecting a row of memory cell plates.

11. The semiconductor memory device according to claim 8, further including:
    a plurality of memory cell arrays;
    in the test mode of operation fewer memory cell arrays are activated than in the normal mode of operation.

12. The semiconductor memory device according to claim 8, wherein the semiconductor memory device is a synchronous dynamic random access memory.

13. A semiconductor memory device, comprising:
    a memory cell array including a row of memory cell areas coupled to a main word line;
    a normal mode of operation in which a plurality of the memory cell areas are activated; and
    a test mode of operation in which fewer of the memory cell areas are activated than in the normal mode.

14. The semiconductor memory device according to claim 13, further including:
    a first sub-word driver circuit for each memory cell area coupled to the main word line; and
    each first sub-word driver circuit is coupled to a select circuit for selecting one of a plurality of sub-word lines in activated memory cell areas.

15. The semiconductor device according to claim 14, wherein the select circuit is coupled to receive at least one row address signal and a test signal.

16. The semiconductor memory according to claim 13, further including:
    a first sub-word driver circuit for each memory cell area coupled to the main word line;
    a second sub-word driver circuit for each memory cell area coupled to the main word line; and
    the first sub-word driver circuit is on the opposite end of the memory cell area than the second sub-word driver circuit.

17. The semiconductor device according to claim 16, further including:
    each first sub-word driver coupled to a select circuit for selecting one of a plurality of sub-word lines in activated memory cell areas;
    the first sub-word driver circuit of at least one memory cell area is coupled to the same select circuit the second sub-word driver in an adjacent memory cell area.

18. The semiconductor memory device according to claim 17, wherein adjacent memory cell areas are activated in the test mode of operation.

19. The semiconductor memory device according to claim 13, wherein the plurality of memory cell areas are divided into at least a first group and second group and the test mode operation includes at least one group signal indicating which group is activated.

20. The semiconductor memory device according to claim 19, wherein the at least one group signal has a logic value indicative of the logic value of at least one external signal sampled during approximately the same time as an external row address is sampled.

* * * * *